(12) United States Patent
Lee et al.

(10) Patent No.: US 9,595,593 B2
(45) Date of Patent: Mar. 14, 2017

(54) SEMICONDUCTOR STRUCTURE WITH INTERFACIAL LAYER AND METHOD FOR MANUFACTURING THE SAME

(71) Applicant: Taiwan Semiconductor Manufacturing Co., Ltd, Hsin-Chu (TW)

(72) Inventors: Wei-Fan Lee, Hsinchu (TW); Chee-Wee Liu, Taipei (TW); Chin-Kun Wang, Hsinchu (TW); Yuh-Ta Fan, Hsinchu (TW); Chih-Hsiung Huang, Kaohsiung (TW); Tzu-Yao Lin, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/753,556

(22) Filed: Jun. 29, 2015

(65) Prior Publication Data

US 2016/0380069 A1  Dec. 29, 2016

(51) Int. Cl.
| | |
|---|---|
| *H01L 21/70* | (2006.01) |
| *H01L 21/336* | (2006.01) |
| *H01L 21/3205* | (2006.01) |
| *H01L 29/51* | (2006.01) |
| *H01L 29/78* | (2006.01) |
| *H01L 29/40* | (2006.01) |
| *H01L 29/423* | (2006.01) |
| *H01L 29/16* | (2006.01) |
| *H01L 29/161* | (2006.01) |

(52) U.S. Cl.
CPC ............ *H01L 29/513* (2013.01); *H01L 29/16* (2013.01); *H01L 29/161* (2013.01); *H01L 29/401* (2013.01); *H01L 29/42364* (2013.01); *H01L 29/42372* (2013.01); *H01L 29/517* (2013.01); *H01L 29/78* (2013.01)

(58) Field of Classification Search
CPC ..... H01L 29/513; H01L 29/16; H01L 29/161; H01L 29/401; H01L 29/42364; H01L 29/42372; H01L 29/517; H01L 29/78
USPC .. 257/407, 329, E21.59, 316, 288, 412, 296, 257/E29.262; 438/268, 299, 199, 586, 438/592, 503
See application file for complete search history.

(56) References Cited

U.S. PATENT DOCUMENTS

| | | | |
|---|---|---|---|
| 2001/0013616 A1* | 8/2001 | Merchant | H01L 21/28194 257/296 |
| 2003/0173586 A1* | 9/2003 | Moriwaki | H01L 21/28185 257/200 |
| 2006/0194451 A1 | 8/2006 | Lee et al. | |

(Continued)

FOREIGN PATENT DOCUMENTS

KR    10-2008-0110524 A    12/2008

*Primary Examiner* — Dzung Tran
(74) *Attorney, Agent, or Firm* — Birch, Stewart, Kolasch & Birch, LLP

(57) ABSTRACT

A semiconductor structure and a method for forming the same are provided. The semiconductor structure includes a substrate and an interfacial layer formed over the substrate. The semiconductor structure further includes a gate structure formed over the interfacial layer. In addition, the interfacial layer is made of metal germanium oxide, metal silicon oxide, or metal germanium silicon oxide and is in direct contact with a top surface of the substrate.

14 Claims, 18 Drawing Sheets

(56) References Cited

U.S. PATENT DOCUMENTS

| | | | |
|---|---|---|---|
| 2010/0044806 A1* | 2/2010 | Hou | H01L 21/28176 257/412 |
| 2010/0320547 A1* | 12/2010 | Ando | H01L 21/28088 257/411 |
| 2010/0327373 A1* | 12/2010 | Carter | H01L 21/28088 257/392 |
| 2011/0012210 A1 | 1/2011 | Xu | |
| 2011/0298053 A1* | 12/2011 | Zhong | H01L 21/28176 257/368 |
| 2012/0003804 A1 | 1/2012 | Huang et al. | |
| 2012/0119204 A1* | 5/2012 | Wong | H01L 21/823842 257/43 |
| 2012/0280288 A1* | 11/2012 | Ando | H01L 21/28176 257/288 |
| 2013/0056836 A1 | 3/2013 | Yu et al. | |
| 2013/0075827 A1 | 3/2013 | Lee et al. | |
| 2013/0078779 A1 | 3/2013 | Xu | |
| 2013/0196515 A1* | 8/2013 | Clark | H01L 21/02068 438/763 |
| 2014/0042524 A1 | 2/2014 | Chuang et al. | |

* cited by examiner

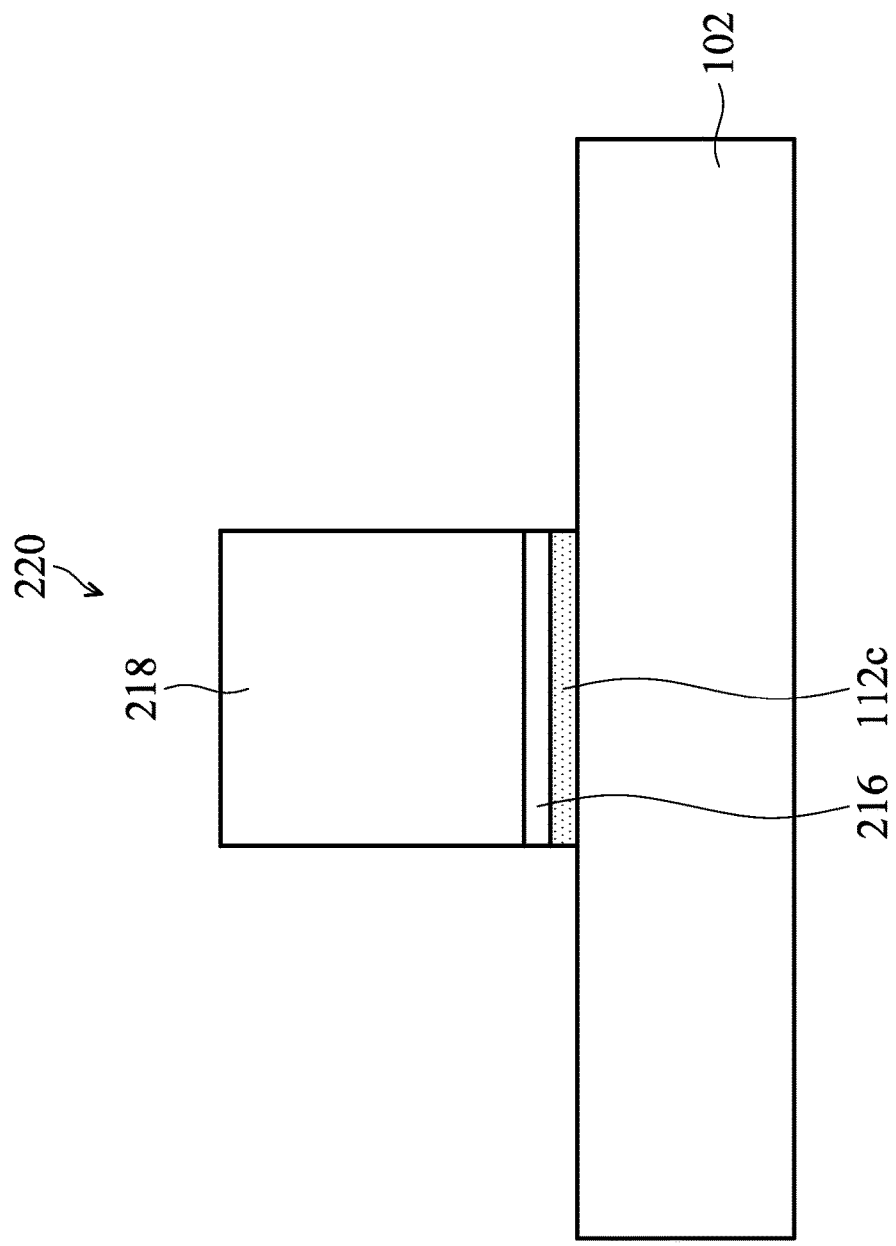

US 9,595,593 B2

SEMICONDUCTOR STRUCTURE WITH INTERFACIAL LAYER AND METHOD FOR MANUFACTURING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A to 3E are cross-sectional representations of various stages of forming a semiconductor structure including an interfacial layer in accordance with some embodiments.

DETAILED DESCRIPTION

Figure 1B:
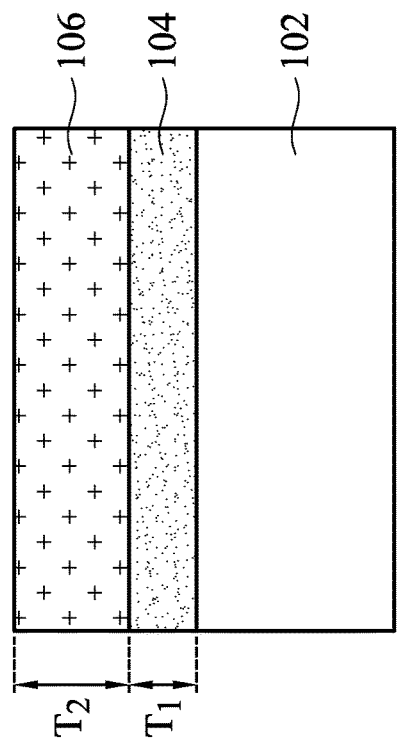
FIGS. 1A to 1F are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for manufacturing the same are provided. The semiconductor structure an interfacial layer formed over a substrate. The interfacial layer is formed by reacting an oxide layer and a metal oxide layer in a spontaneous reaction at a relatively low temperature. The resulting semiconductor structure can have a relatively low equivalent oxide thickness (EOT) and low interface trap density (Dit).

Figure 1A:
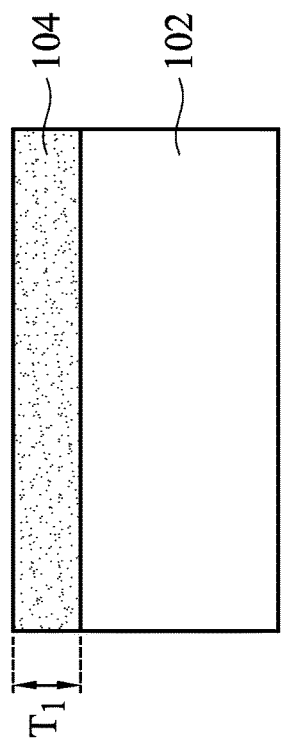

FIGS. 1A to 1F are cross-sectional representations of various stages of forming a semiconductor structure 100a in accordance with some embodiments. As shown in FIG. 1A, a substrate 102 is provided in accordance with some embodiments. Substrate 102 may be a semiconductor wafer. In some embodiments, substrate 102 is made of a first compound. In some embodiments, the first compound is Ge, Si, or SiGe. That is, substrate 102 may be a silicon substrate, a germanium substrate, or a silicon germanium substrate.

An oxide layer 104 is formed over substrate 102, as shown in FIG. 1A in accordance with some embodiments. In some embodiments, oxide layer 104 is made of the oxide of the first compound, of which substrate 102 is made. In some embodiments, oxide layer 104 is made of germanium oxide, silicon oxide, or silicon germanium oxide. In some embodiments, substrate 102 is a germanium substrate, and oxide layer 104 is made of $GeO_2$.

In some embodiments, oxide layer 104 is formed by oxidizing the top surface of substrate 102 by a rapid thermal process or a furnace annealing process. In some embodiments, oxide layer 104 is formed by a deposition process such as an atomic layer deposition (ALD) process, a chemical vapor deposition (CVD) process, or a physical vapor deposition (PVD) process.

In some embodiments, oxide layer 104 has a thickness $T_1$ in a range from about 0.1 nm to about 10 nm. The thickness of oxide layer 104 may affect the thickness of the interfacial layer formed in sequential manufacturing processes. Details of forming the interfacial layer will be described later.

After oxide layer 104 is formed, a first metal oxide layer 106 is formed over oxide layer 104, as shown in FIG. 1B in accordance with some embodiments. The material used to form first metal oxide layer 106 is chosen to have a standard free energy that is smaller than the standard free energy of the material used to form oxide layer 104 in accordance with some embodiments. The standard free energy may be defined as the free energy of a reaction of reacting a metal and oxygen to form a metal oxide at 1 atm under 25° C. per mole. The free energy of $M_xO_y$ shown in the following formula may be defined as the standard free energy of $M_xO_y$.

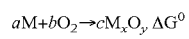
$$aM + bO_2 \rightarrow cM_xO_y \ \Delta G^0$$

In above formula, x is a positive integral, y is a positive integral, and a, b, and c are equilibrium constants of the reaction. When the standard free energy of the metal oxide used to form first metal oxide layer 106 is smaller than the standard free energy of the oxide (e.g. $GeO_2$) used to form oxide layer 104, first metal oxide layer 106 may tend to capture oxygen in oxide layer 104 in subsequent processes (Details will be described later).

In some embodiments, first metal oxide layer 106 is made of a material comprising Al, Y, Ga, Sc, La, Ce, Pr, Nd, Pm, Sm, Eu, Gd, Tb, Dy, Ho, Er, Tm, Yb, or Lu. In some embodiments, first metal oxide layer 106 is made of oxide of Al, Y, Ga, Sc, La, Ce, Pr, Nd, Pm, Sm, Eu, Gd, Tb, Dy, Ho, Er, Tm, Yb, or Lu. First metal oxide layer 106 may be formed by chemical vapor deposition (CVD), physical vapor deposition, (PVD), atomic layer deposition (ALD), spin-on coating, or other applicable processes.

In some embodiments, first metal oxide layer 106 has a thickness $T_2$ in a range from about 0.1 nm to about 10 μm. The thickness of first metal oxide layer 106 may affect the thickness of the interfacial layer formed in sequential manufacturing processes. Details of forming the interfacial layer will be described later.

Figure 1D:
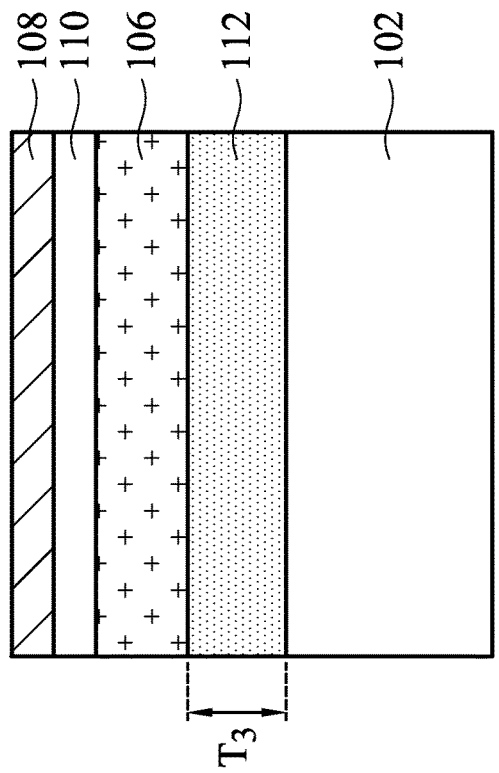
Figure 1C:
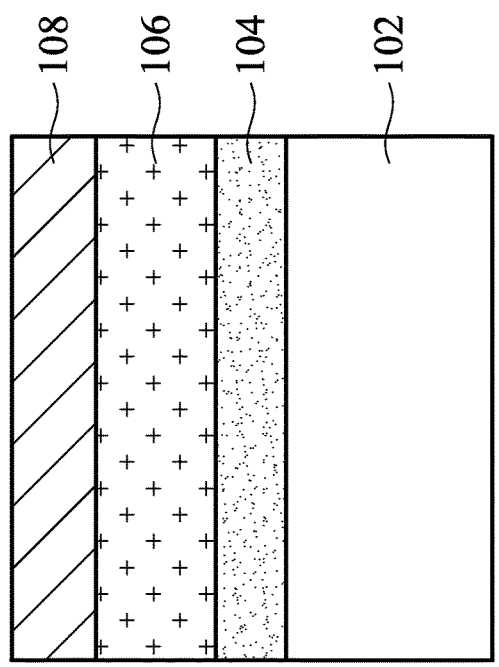

After first metal oxide layer 106 is formed, a metal layer 108 is formed over first metal oxide layer 106, as shown in FIG. 1C in accordance with some embodiments. In some embodiments, metal layer 108 is made of Al, Y, Ga, Sc, La, Ce, Pr, Nd, Pm, Sm, Eu, Gd, Tb, Dy, Ho, Er, Tm, Yb, or Lu. In some embodiments, metal layer 108 and first metal oxide layer 106 include the same metal element. In some embodiments, first metal oxide layer 106 is made of a material that is the oxide of the material used to form metal layer 108.

When metal layer 108 is formed over first metal oxide layer 106, the top portion of first metal oxide layer 106 will spontaneously react with metal layer 108 to form a second metal oxide layer 110 and a bottom of first metal oxide layer 106 will spontaneously react with oxide layer 104 to form an interfacial layer 112, as shown in FIG. 1D in accordance with some embodiments.

More specifically, when metal layer 108 is formed over first metal oxide layer 106, the top surface of first metal oxide layer 106 is in direct contact with metal layer 108. Oxygen in the top portion of first metal oxide layer 106 tends to be captured by metal layer 108, resulting in the formation of second oxide layer 110. When second oxide layer 110 is formed, first metal oxide layer 106 may further capture oxygen from oxide layer 104 formed below, and therefore, interfacial layer 112 is formed. As described previously, in some embodiments, first metal oxide layer 106 is made of the metal oxide which has a standard free energy that is smaller than that of the oxide used to form oxide layer 106. It was found that when the materials used to form oxide layer 104 and first metal oxide layer 106 are chosen according to their free energy, the reaction of forming interfacial layer 112 may react more easily. For example, interfacial layer 112 can be formed in a spontaneous reaction under a temperature lower than 100° C.

Since second metal oxide layer 110 is formed by a spontaneous reaction between metal layer 108 and first metal oxide layer 106, second metal oxide layer 110 is made of a material including the metal in metal layer 108 and the metal in first metal oxide layer 106, although metal layer 108 and first metal oxide layer 106 may include the same metal element. For example, metal layer 108 is made of Al, first metal oxide layer is made of $Al_2O_3$, and second metal oxide layer is made of $AlO_x$ (x is a positive integral or fraction). When first metal oxide layer 106 and metal layer 108 include the same metal element, the reaction of forming second metal oxide layer 110 by reacting first metal oxide layer 106 and metal layer 108 may become more easily. In some embodiments, second metal oxide layer 110 is formed in a first spontaneous reaction under a temperature in a range from about 0° C. to about 50° C.

After second metal oxide layer 110 is formed, interfacial layer 112 is formed by a spontaneous reaction between oxide layer 104 and first metal oxide layer 106. As described previously, in some embodiments, substrate 102 is made of the first compound (e.g. Ge), and oxide layer 104 is made of the oxide of the first compound (e.g. $GeO_2$). In addition, interfacial layer 112 is made of a second compound including metal, oxygen, and the first compound in accordance with some embodiments. Compared to oxide layer 104, interfacial layer 112 may have better stability and have fewer defects.

In some embodiments, substrate 102 is made of Si, Ge, or SiGe, and interfacial layer 112 is made of metal germanium oxide ($M_xGe_yO_z$), metal silicon oxide ($M_xSi_yO_z$), or metal germanium silicon oxide ($M_xGe_ySi_zO_1$). It should be noted that x, y, z, 1 in each chemical formula is a positive integral and the values of them may be different in each case. In some embodiments, the metal (M) in interfacial layer 112 includes Al, Y, Ga, Sc, La, Ce, Pr, Nd, Pm, Sm, Eu, Gd, Tb, Dy, Ho, Er, Tm, Yb, or Lu. In some embodiments, interfacial layer 112 is made of a ternary compound. In some embodiments, interfacial layer 112 is formed under a temperature lower than 100° C. In some embodiments, interfacial layer 112 is formed in a second spontaneous reaction under a temperature in a range from about 0° C. to about 50° C.

In some embodiments, interfacial layer 112 has a thickness $T_3$ in a range from about 0.1 nm to about 50 nm. Interfacial layer 112 may be used in a transistor structure. For example, interfacial layer 112 may be formed over a channel region below a gate structure. Accordingly, if interfacial layer 112 is too thick, the capacitance of the transistor structure may be too high. On the other hand, if interfacial layer 112 is too thin, electrons may be easily pass through interfacial layer 112, resulting in electron tunneling.

In some embodiments, oxide layer 104 is completely transformed into interfacial layer 112, as shown in FIG. 1D in accordance with some embodiments. Accordingly, interfacial layer 112 is in direct contact with the top surface of substrate 102.

Figure 1F:
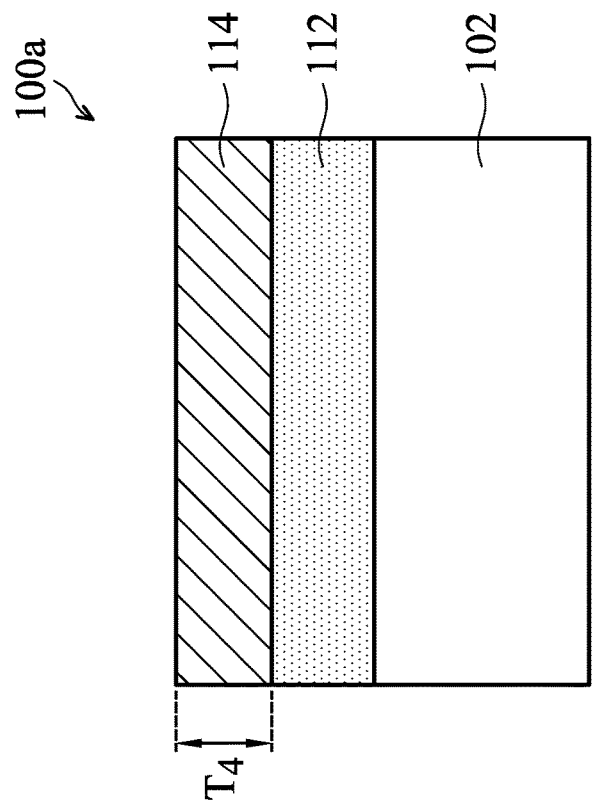
Figure 1E:
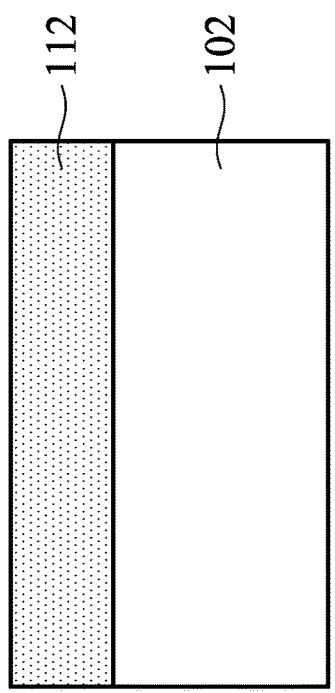

After interfacial layer 112 is formed, metal layer 108, second oxide layer 110, and first metal oxide layer 106 are removed, as shown in FIG. 1E in accordance with some embodiments. Metal layer 108, second oxide layer 110, and first metal oxide layer 106 may be removed separately or may be removed by the same process. In some embodiments, metal layer 108, second oxide layer 110, and first metal oxide layer 106 are removed by chemical polishing processes (CMP), wet etching processes, or dry etching processes.

After metal layer 108, second oxide layer 110, and first metal oxide layer 106 are removed, a cap layer 114 is formed over interfacial layer 112, as shown in FIG. 1F in accordance with some embodiments. In some embodiments, cap layer 114 is a metal layer. Examples of the metal used to make the metal layer may include, but are not limited to, W, Cu, Ni, Pt, Co, Au, Ag, Cr, or the like. In some embodiments, cap layer 114 is a gate dielectric layer. Examples of the material used to make the gate dielectric layer may include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO$_2$—Al$_2$O$_3$) alloy, or other applicable dielectric materials.

In some embodiments, cap layer 114 is a work function metal layer. Examples of the material used to make the work function metal layer may include, but are not limited to, TaSiN, TaAl, IrO$_x$, Al, AlCO, AlTiCO, AlCu, TiN, WN, W, TiAl, TiAlN, TaCN, or the like. In some embodiments, cap layer 114 is a gate electrode layer. Examples of the material used to make the gate electrode layer may include, but are not limited to, Al, Ti, Ta, W, Cu, Ni, Pt, Co, Au, Ag, Cr, or the like. In some embodiments, cap layer 114 is made of metal silicide. In some embodiments, cap layer 114 has a thickness T$_4$ in a range from about 0.1 nm to about 10 µm.

As shown in FIG. 1F, semiconductor structure 100a includes interfacial layer 112 formed over substrate 102 and is in direct contact with the top surface of substrate 102. In some embodiments, interfacial layer 112 is made of a ternary compound, such as metal germanium oxide. In some embodiments, interfacial layer 112 is formed by reacting oxide layer 104 and first metal oxide layer 106 in a spontaneous reaction under a relatively low temperature, such as lower than 100° C. The resulting interfacial layer 112 may have good stability compared to oxide layer 104, and have low equivalent oxide thickness (EOT) and interface trap density (Dit) compared to the material formed under high temperature. Therefore, the carrier transporting speed and the performance of semiconductor structure 100a can be improved.

It should be noted that, although oxide layer 104 has been completely transformed into interfacial layer 112 in the embodiments shown in FIG. 1D, a bottom portion of oxide layer 104 may not be reacted with first metal oxide later 106 in some other embodiments. That is, a bottom portion of oxide layer 104 may still remain between substrate 102 and interfacial layer 112. In addition, in some embodiments, first metal oxide layer 106 is completely reacted with oxide layer 104 and metal layer 108 to form interfacial layer 112 and second metal oxide layer 110 respectively. That is, there may be no first oxide layer 106 left between interfacial layer 112 and second metal oxide layer 110. Furthermore, in some embodiments, metal layer 108 is completely reacted with first metal oxide layer 106. That is, metal layer 108 may be completely transformed into second metal oxide layer 110. It should be noted that these embodiments are merely examples for better understanding the disclosure, and the scope of the disclosure is not intended to be limited.

Figure 2B:
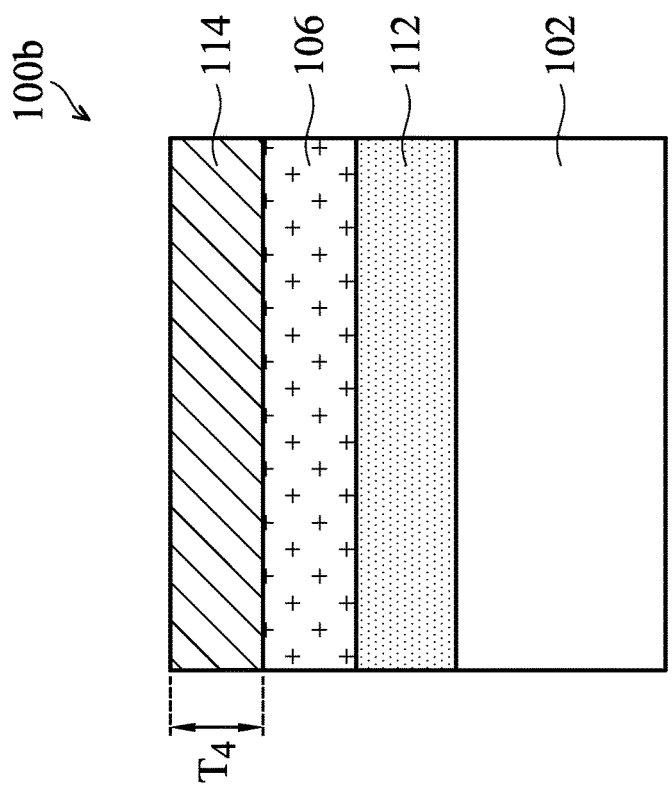
FIGS. 2A and 2B are cross-sectional representation of a semiconductor structure in accordance with some embodiments.
Figure 2A:
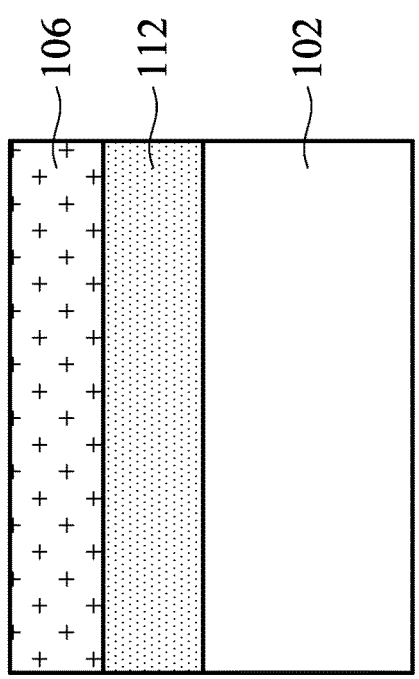

FIGS. 2A and 2B are cross-sectional representation of a semiconductor structure 100b in accordance with some embodiments. Materials and processes used to form semiconductor structure 100b are similar to those used to form semiconductor structure 100a shown in FIGS. 1A to 1F, except first metal oxide layer 106 is not removed.

More specifically, processes described above and shown in FIGS. 1A to 1D are performed. That is, after metal layer 108 is formed over first metal oxide layer 106, interfacial layer 112 is formed between substrate 102 and first metal oxide layer 106. After interfacial layer 112 is formed, metal layer 108 and second oxide layer 110 are removed, as shown in FIG. 2A in accordance with some embodiments. However, first metal oxide layer 106 is not removed in theses embodiments.

Similarly, metal layer 108 and second oxide layer 110 may be removed separately or may be removed by the same process. In some embodiments, metal layer 108 and second oxide layer 110 are removed by chemical polishing processes (CMP), wet etching processes, or dry etching processes.

After metal layer 108 and second oxide layer 110 are removed, cap layer 114 is formed over first metal oxide layer 106, as shown in FIG. 2B in accordance with some embodiments. As described previously, cap layer 114 may be a metal layer, a gate dielectric layer, a work function metal layer, a gate electrode layer, or the like.

As shown in FIG. 2B, semiconductor structure 100b includes interfacial layer 112 formed between substrate 102 and first metal oxide layer 106. Since interfacial layer 112 is formed by reacting oxide layer 104 and first metal oxide layer 106 in a spontaneous reaction under a relatively low temperature, such as lower than 100° C., the equivalent oxide thickness (EOT) and interface trap density (Dit) can be relatively improved. Therefore, the carrier transporting speed can also be improved.

In addition, in some embodiments, first metal oxide layer 106 positioned between interfacial layer 112 and cap layer 114 may be used as a gate dielectric layer in a gate structure formed thereon, and the manufacturing process is therefore simplified.

Interfacial layer 112 described above may be applied to various structure and applications, and the scope of the disclosure is not intended to be limiting. FIGS. 3A to 3E are cross-sectional representations of various stages of forming a semiconductor structure 100c including interfacial layer 112 in accordance with some embodiments.

Figure 3A:
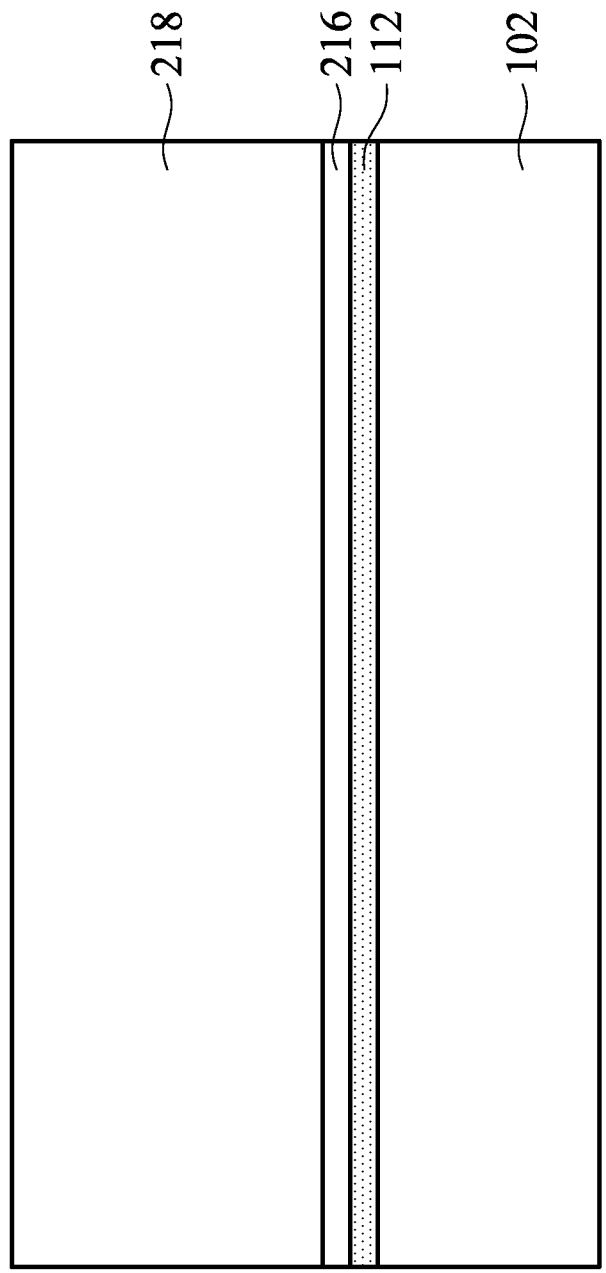

Interfacial layer 112 is formed over substrate 102, as shown in FIG. 3A in accordance with some embodiments. Interfacial layer 112 may be formed by the processes shown in FIGS. 1A to 2B and described previously and are not repeated herein. For examples, processes described previously and shown in FIGS. 1A to 1E are performed to form interfacial layer 112 over substrate 102. After interfacial layer 112 is formed over substrate 102 and the material layers formed over interfacial layer 112 are removed, a gate dielectric layer 216 is formed over interfacial layer 112, as shown in FIG. 3A in accordance with some embodiments.

In some embodiments, gate dielectric layer 216 is made of high-k dielectric materials, such as metal oxide in accordance with some embodiments. Examples of the high-k dielectric material include, but are not limited to, hafnium oxide (HfO$_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO$_2$—Al$_2$O$_3$) alloy, or other applicable dielectric materials. Gate dielectric layer 216 may be formed by chemical vapor deposition (CVD), physical vapor deposition, (PVD), atomic layer deposition (ALD), spin-on coating, or other applicable processes.

After gate dielectric layer 216 is formed, dummy gate electrode layer 218 is formed over gate dielectric layer 216 in accordance with some embodiments. In some embodiments, dummy gate electrode layer 218 is made of polysilicon.

Figure 3C:
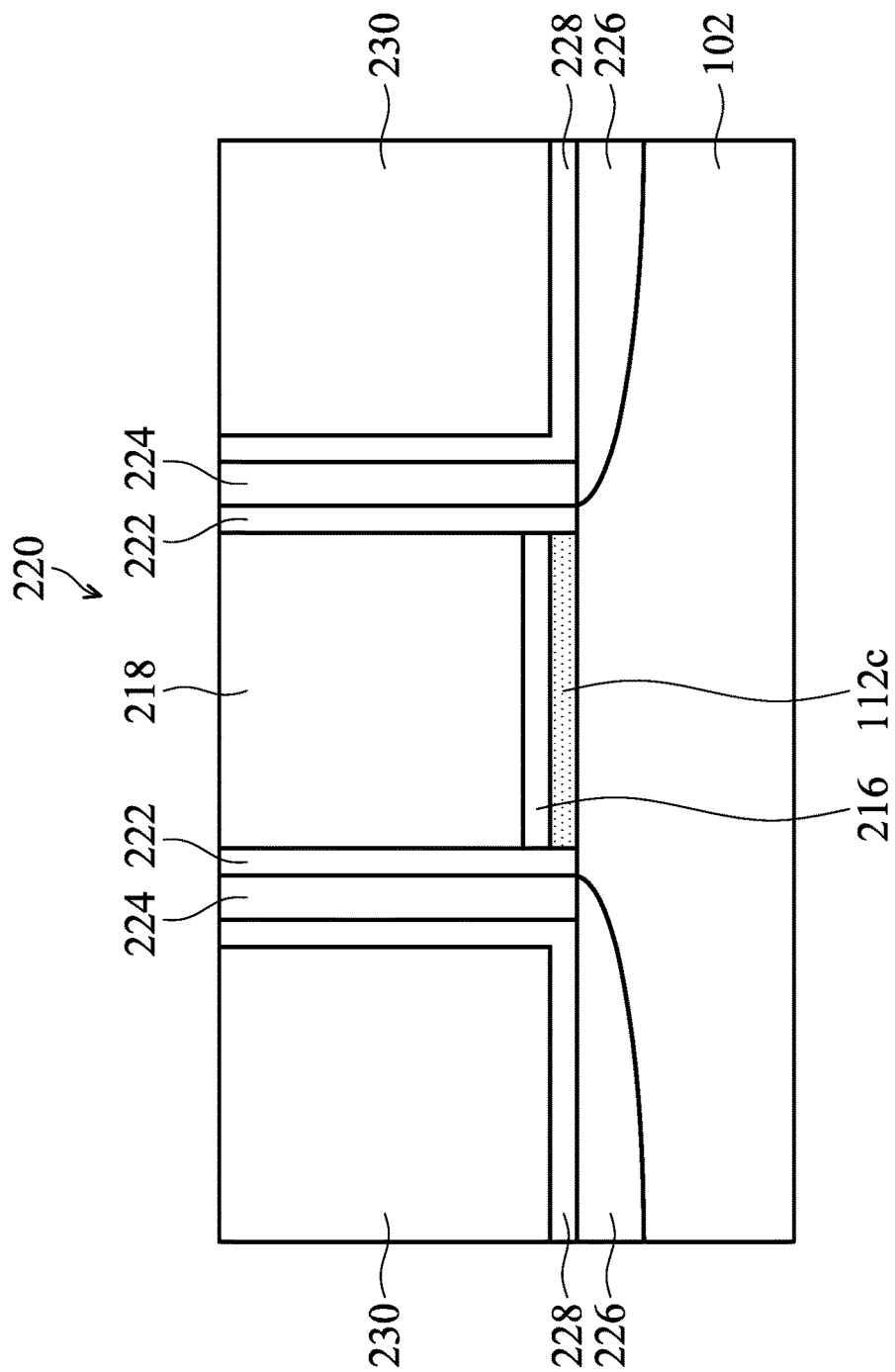

Next, interfacial layer 112, gate dielectric layer 216, and dummy gate electrode layer 218 are patterned to form a dummy gate structure 220 over a patterned interfacial layer 112c, as shown in FIG. 3B in accordance with some embodiments. Afterwards, sealing layers 222 are formed on the sidewalls of dummy gate structure 220, as shown in FIG. 3C in accordance with some embodiments. Sealing layer 222 may protect dummy gate structure 220 from damage or loss during subsequent processing and may also prevent oxidation during subsequent processing. In some embodiments, sealing layer 222 is made of silicon nitride, silicon oxide, silicon oxynitride, silicon carbide, or other applicable dielectric materials. Sealing layer 222 may include a single layer or multiple layers.

Spacers 224 are further formed on sealing layer 222 in accordance with some embodiments. In some embodiments, spacers 224 are made of silicon nitride, silicon oxide, silicon carbide, silicon oxynitride, or other applicable materials.

Source/drain structures 226 are formed in substrate 102 adjacent to dummy gate structure 220, as shown in FIG. 3C in accordance with some embodiments. In some embodiments, source/drain structures 226 are formed by using an implantation process or an epitaxial (epi) process. In some embodiments, source/drain structures 226 include Ge, SiGe, InAs, InGaAs, InSb, GaAs, GaSb, InAlP, InP, SiP, SiCP, or the like.

After source/drain structures 226 are formed in substrate 102, a contact etch stop layer (CESL) 228 is formed over substrate 102, and an interlayer dielectric layer 230 is formed over contact etch stop layer 228, as shown in FIG. 3C in accordance with some embodiments. As shown in FIG. 3C, contact etch stop layer 228 is formed on the sidewalls of spacers 224 and the top surface of source/drain structures 226 in accordance with some embodiments. In some embodiments, contact etch stop layer 228 is made of silicon nitride, silicon oxynitride, and/or other applicable materials. Contact etch stop layer 228 may be formed by chemical vapor deposition (CVD), physical vapor deposition, (PVD), atomic layer deposition (ALD), spin-on coating, or other applicable processes.

In some embodiments, interlayer dielectric layer 230 is made of silicon oxide, silicon nitride, phosphosilicate glass (PSG), borophosphosilicate glass (BPSG), and/or other applicable dielectric materials. Interlayer dielectric layer 230 may be formed by chemical vapor deposition (CVD), physical vapor deposition, (PVD), atomic layer deposition (ALD), spin-on coating, or other applicable processes.

Figure 3D:
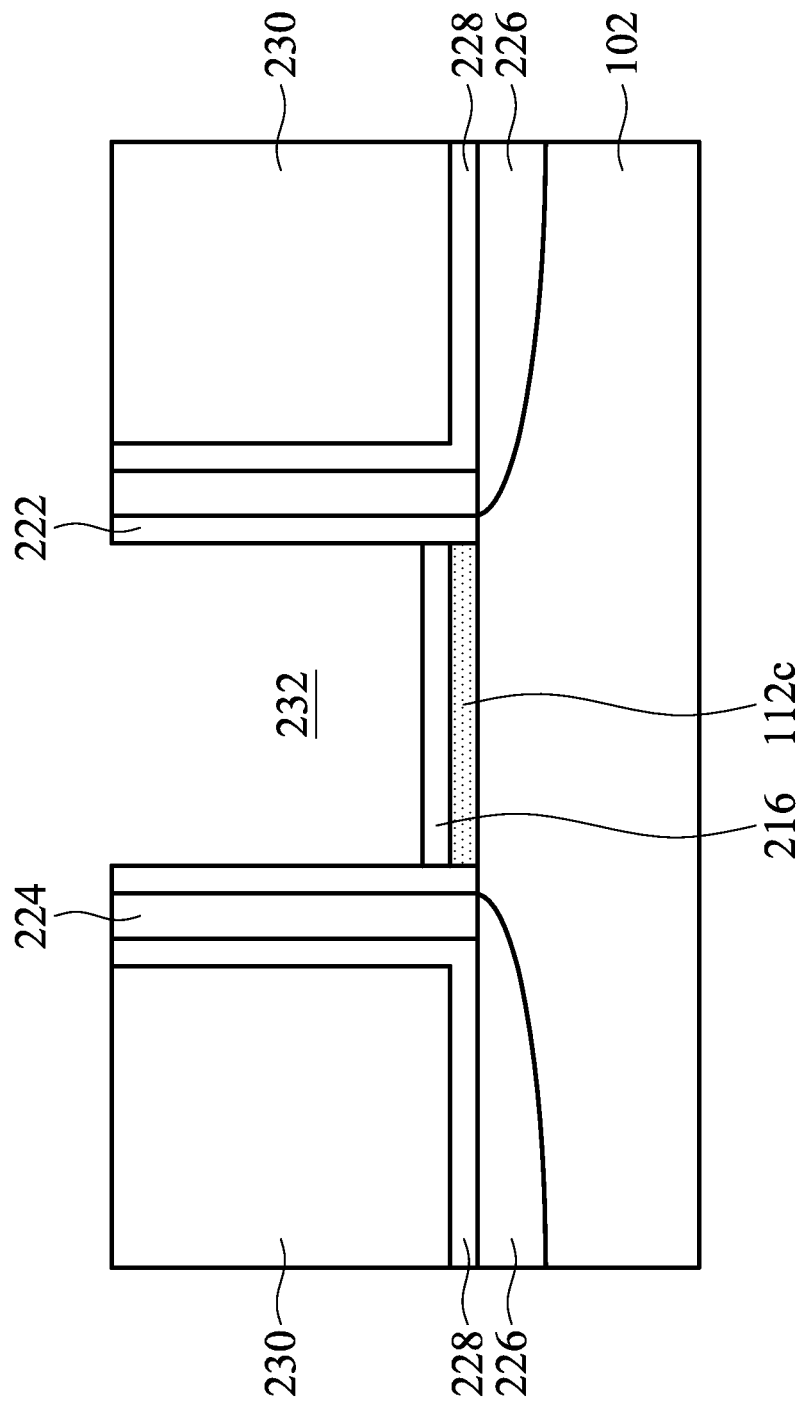

After interlayer dielectric layer 230 is formed, dummy gate structure 220 is removed to form a trench 232 between spacers 224, as shown in FIG. 3D in accordance with some embodiments. Gate dielectric layer 216 is therefore exposed by trench 232. Afterwards, a gate structure 234c is formed in trench 232 over gate dielectric layer 216 and interfacial layer 112c in accordance with some embodiments.

Figure 3E:
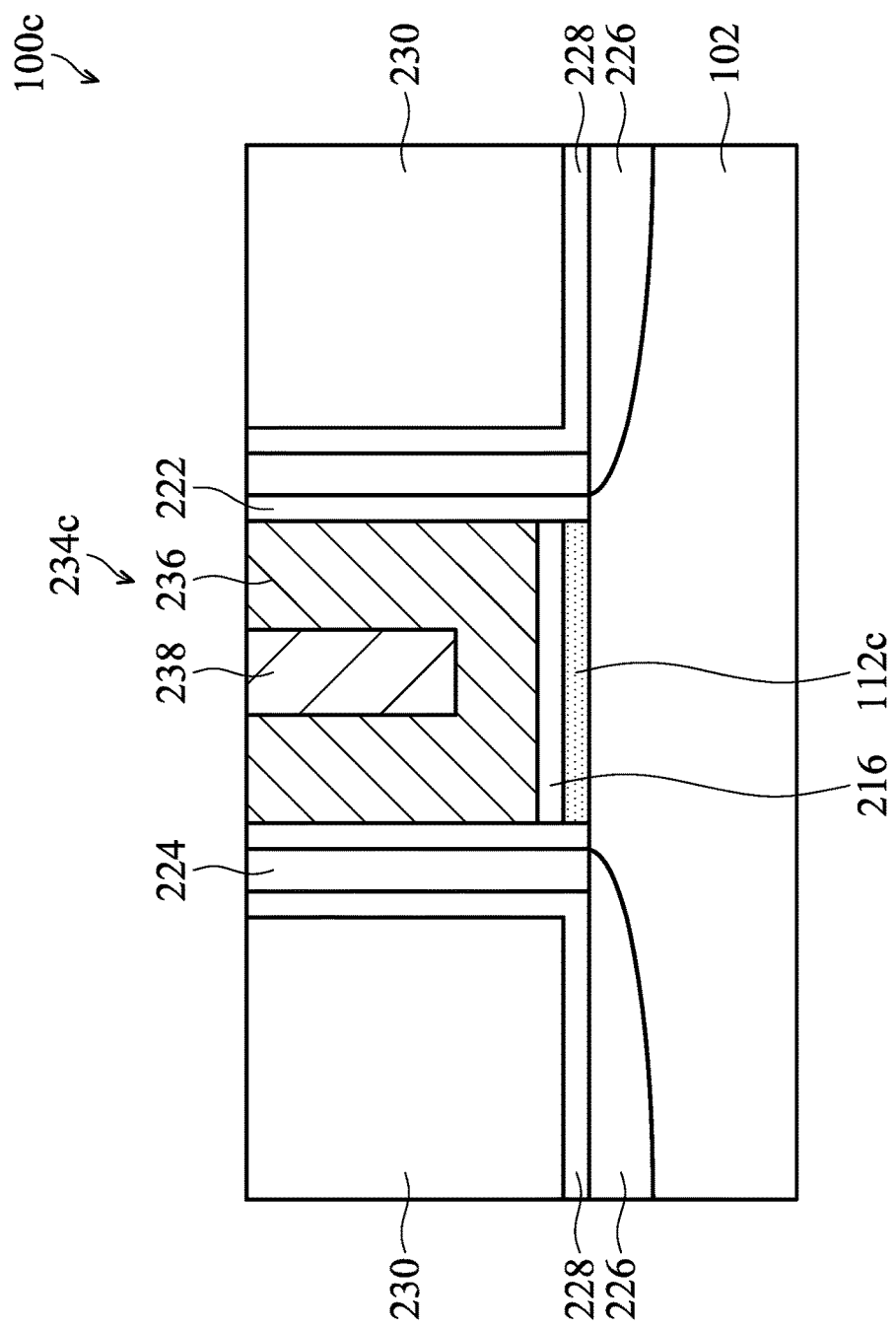

In some embodiments, gate structure 234c is a metal gate structure including a work function metal layer 236 and a gate electrode layer 238, as shown in FIG. 3E in accordance with some embodiments.

Work function metal layer 236 is tuned to have a proper work function. In some embodiments, work function metal layer 236 is made of metal nitride. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

In some embodiments, gate electrode layer 238 is made of a conductive material, such as a metal. Examples of the conductive materials used to form gate electrode 238 may include, but are not limited to, aluminum, copper, tungsten, titanium, tantalum, or other applicable materials.

Semiconductor structure 100c includes interfacial layer 112c, gate dielectric layer 216, work function metal layer 236, and gate electrode layer 238 in accordance with some embodiments. In some embodiments, interfacial layer 112c and gate dielectric layer 216 are made of different materials. In some embodiments, interfacial layer 112c and work function metal layer 236 are made of different materials. In addition, as shown in FIG. 3E, interfacial layer 112c is formed over a region of substrate 102 between source/drain structure 226. That is, interfacial layer 112c is formed over the channel region of semiconductor structure 100c and in direct contact with the top surface of substrate 102.

As described previously, interfacial layer 112c may be formed by reacting first metal oxide 106 and oxide layer 104 (not shown in FIG. 3E, referring to FIGS. 1A to 1D), and therefore EOT and Dit can be relatively low.

In addition, in some embodiments, interfacial layer 112c is made of metal germanium oxide, metal silicon oxide, or metal germanium silicon oxide, and therefore interfacial layer 112c may have fewer defects on its top surface, compared to an oxide such as $GeO_2$. Therefore, the performance of semiconductor structure 100c including interfacial layer 112c may be improved.

Figure 4A:
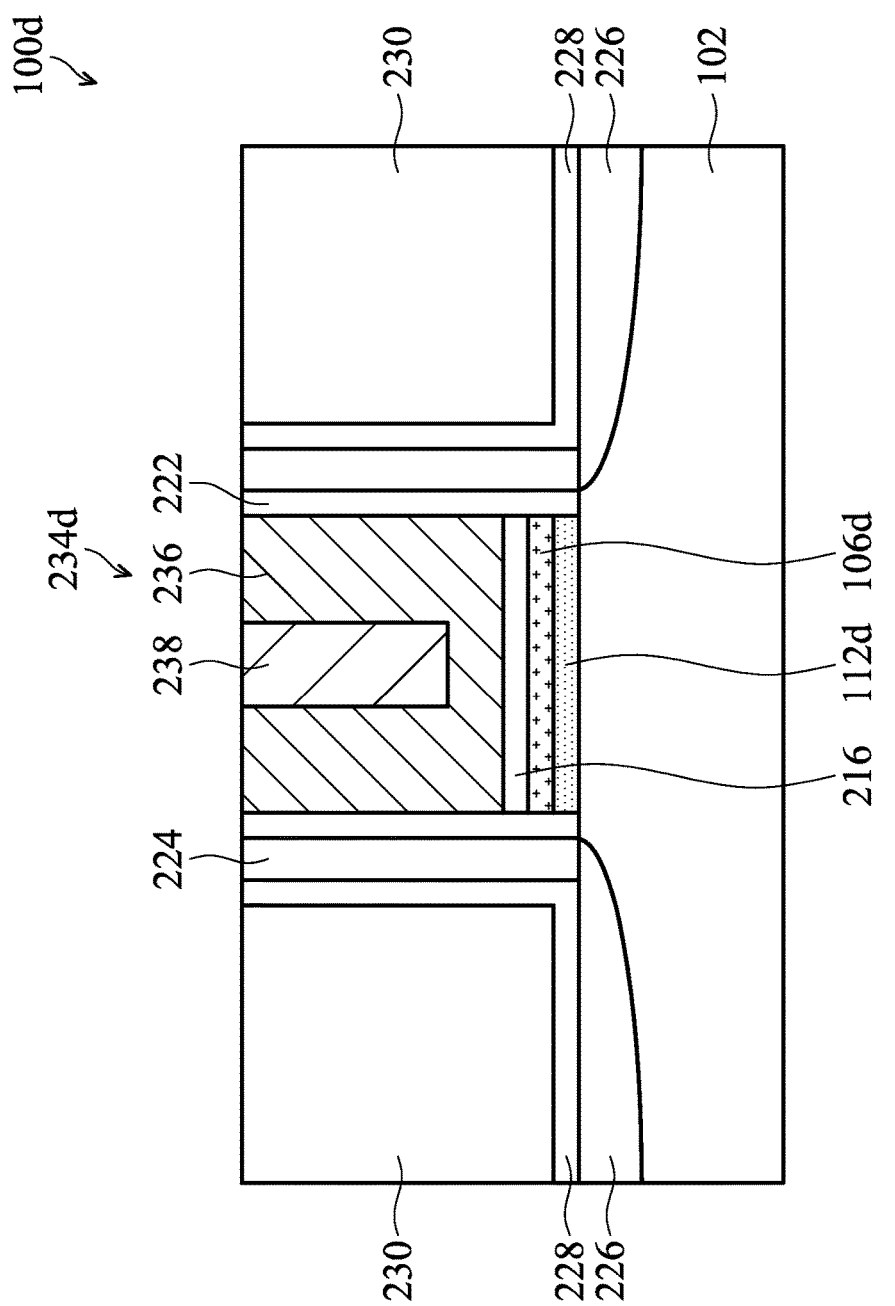
FIGS. 4A to 4C are cross-sectional representations of semiconductor structures including interfacial layers in accordance with some embodiments.
Figure 4B:
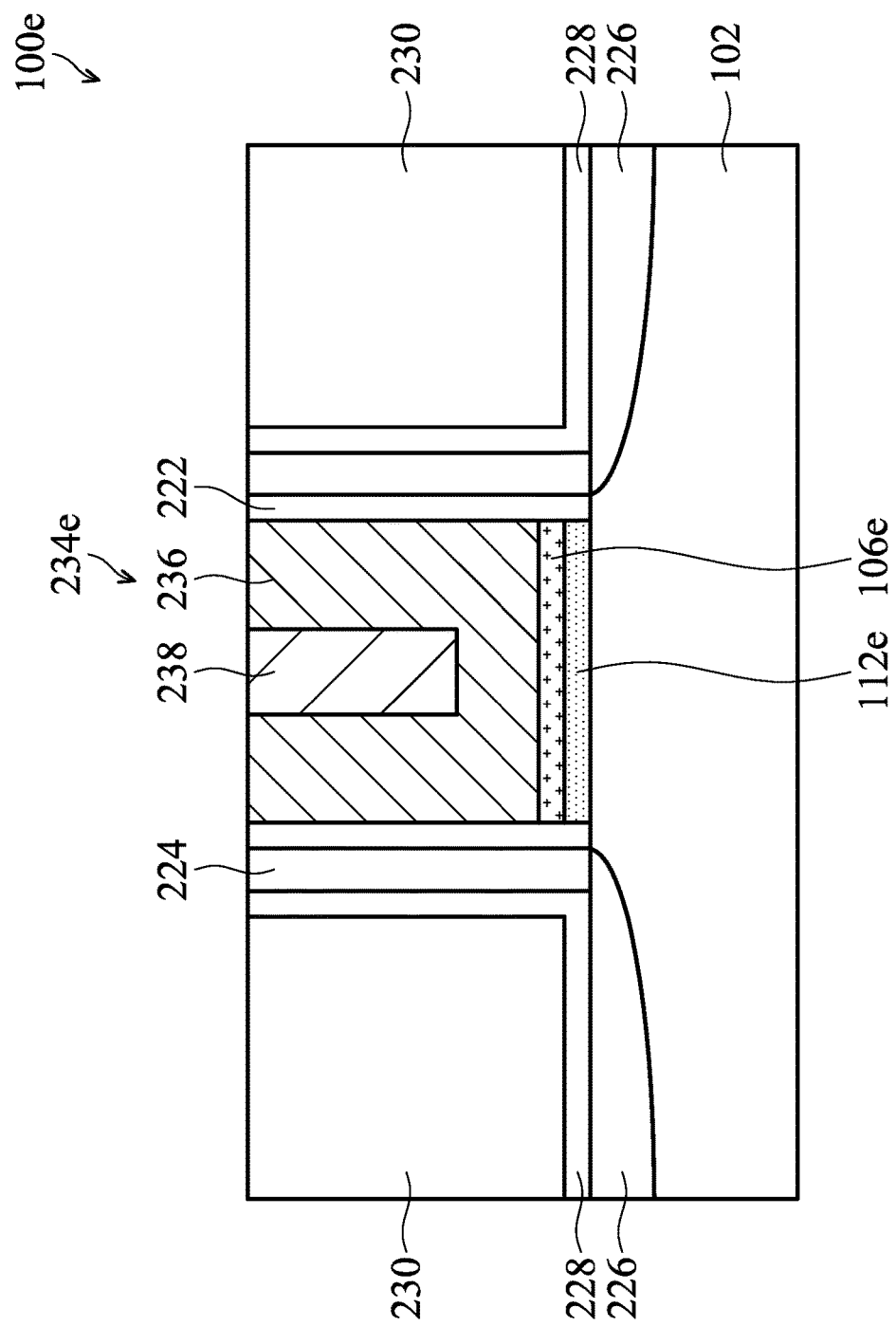
Figure 4C:
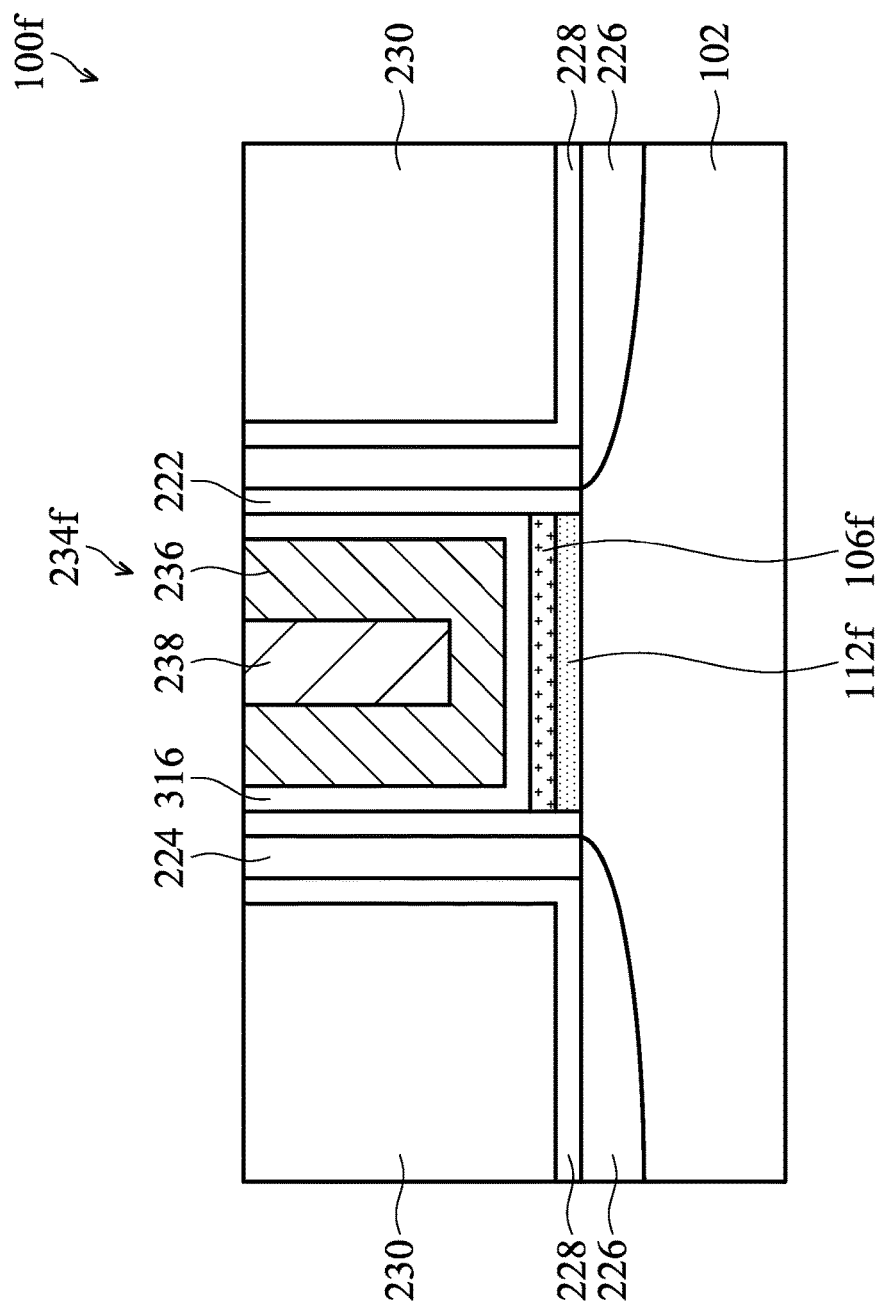

FIGS. 4A to 4C are cross-sectional representations of semiconductor structures 100d, 100e, and 100f in accordance with some embodiments. Some processes and materials used to form semiconductor structures 100d, 100e, and 100f may be similar to, or the same as, those used to form semiconductor structure 100c and are not repeated herein.

More specifically, semiconductor structure 100d includes an interfacial layer 112d, first metal oxide layer 106d, and a gate structure 234d, as shown in FIG. 4A in accordance with some embodiments. Interfacial layer 112d is formed over substrate 102 and is in direct contact with substrate 102. First metal oxide layer 106d is positioned between interfacial layer 112d and gate structure 234d. Interfacial layer 112d may be formed by the processes described previously. For example, interfacial layer 112d is formed by reacting an oxide layer (e.g. oxide layer 104 shown in FIG. 1C) and a first metal oxide layer (e.g. first metal oxide layer 106 shown in FIG. 1C), as shown in FIGS. 1A to 2B and described previously. Since interfacial layer 112d is formed by reacting the oxide layer and the first metal oxide layer, interfacial layer 112d and first metal oxide layer 106d may include the same metal element. In addition, first metal oxide layer 106d is not removed in these embodiments. In some embodiments, first metal oxide layer 106d is used as a gate dielectric layer positioned below gate structure 234d.

After the interfacial layer (e.g. interfacial layer 112) and the first metal oxide layer (e.g. first metal oxide layer 106) are formed over substrate 102, processes similar to, or the same as, those shown in FIGS. 3A to 3E are performed in accordance with some embodiments. Accordingly, gate structure 234d, including work function metal layer 236 and gate electrode layer 238, is formed over gate dielectric layer 216, first metal oxide layer 106d, and interfacial layer 112d in accordance with some embodiments. In some embodiments, interfacial layer 112d, first metal oxide layer 106d, gate dielectric layer 216, work function metal layer 236, and gate electrode layer 238 are all made of different materials.

Semiconductor structure 100e shown in FIG. 4B are similar to semiconductor structures 100c and 100d shown in FIGS. 3E and 4A and described previously, except no additional gate dielectric layer is formed in accordance with some embodiments.

For example, in the process of forming semiconductor structure 100e, a dummy gate electrode layer may be formed on a first metal oxide layer (e.g. first metal oxide layer 106) over an interfacial layer (e.g. interfacial layer 112) over substrate 102. Accordingly, after the dummy gate electrode layer and the interfacial layer are patterned and the dummy gate electrode layer is removed, the resulting trench will directly expose the top surface of first metal oxide layer 106e. Therefore, a gate structure 234e, including work function metal layer 236 and gate electrode layer 238, is formed directly over first metal oxide layer 106e. In some embodiments, first metal oxide layer 106e is used as a gate dielectric layer below gate structure 234e.

In some other examples, a dummy gate dielectric layer (e.g. gate dielectric layer 216) is formed before a dummy gate electrode layer is formed but is removed with the removal of the dummy gate electrode layer. Accordingly, gate structure 234e is still formed directly over first metal oxide layer 106e.

Semiconductor structure 100f shown in FIG. 4C is similar to semiconductor structure 100e shown in FIG. 4B and described previously, except an additional gate dielectric layer 316 is formed in accordance with some embodiments.

As shown in FIG. 4C, semiconductor structure 100f includes an interfacial layer 112f formed over substrate 102, first metal oxide layer 106f formed over interfacial layer 112f, and a gate structure 234f formed over first metal oxide layer 106f in accordance with some embodiments. In addition, gate structure 234f further includes gate dielectric layer 316 positioned below work function metal layer 236 and gate electrode layer 238. As shown in FIG. 4C, gate dielectric layer 316 is deposited in the trench which is formed by removing the dummy gate structure, similar to trench 232 shown in FIG. 3D, and therefore gate dielectric layer 316 is formed on the sidewalls and the bottom surface of the trench.

Figure 5A:
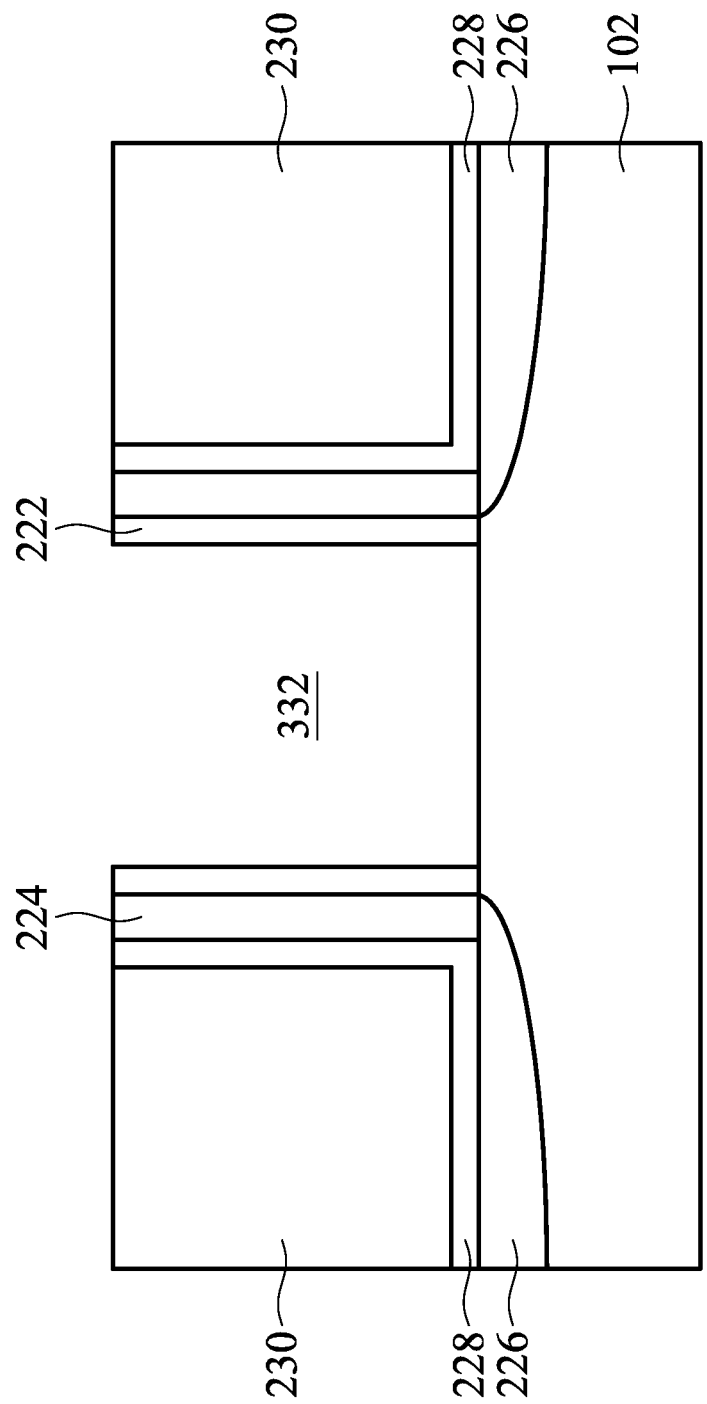
FIGS. 5A to 5C are cross-sectional representations of various stages of forming a semiconductor structure including an interfacial layer in accordance with some embodiments.
Figure 5B:
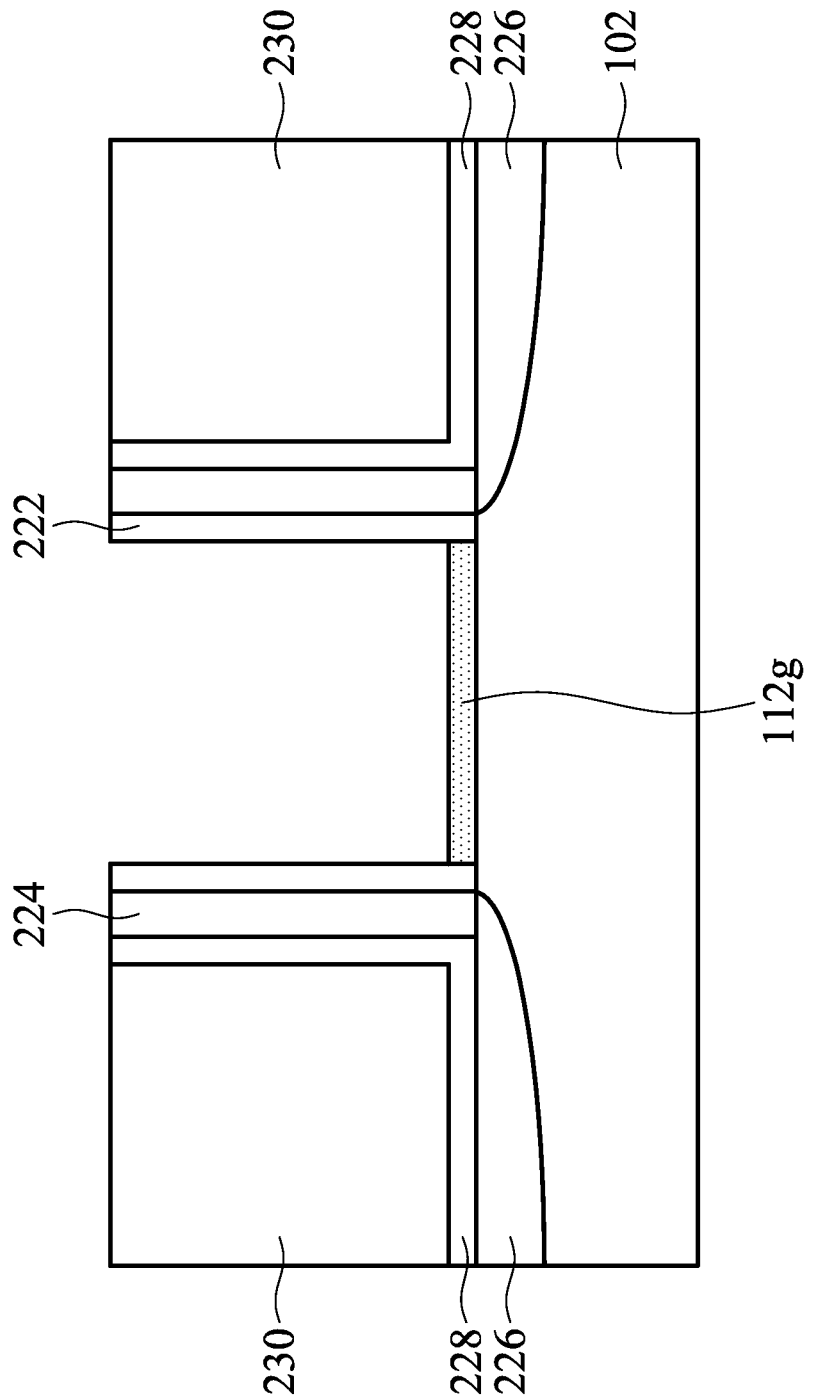
Figure 5C:
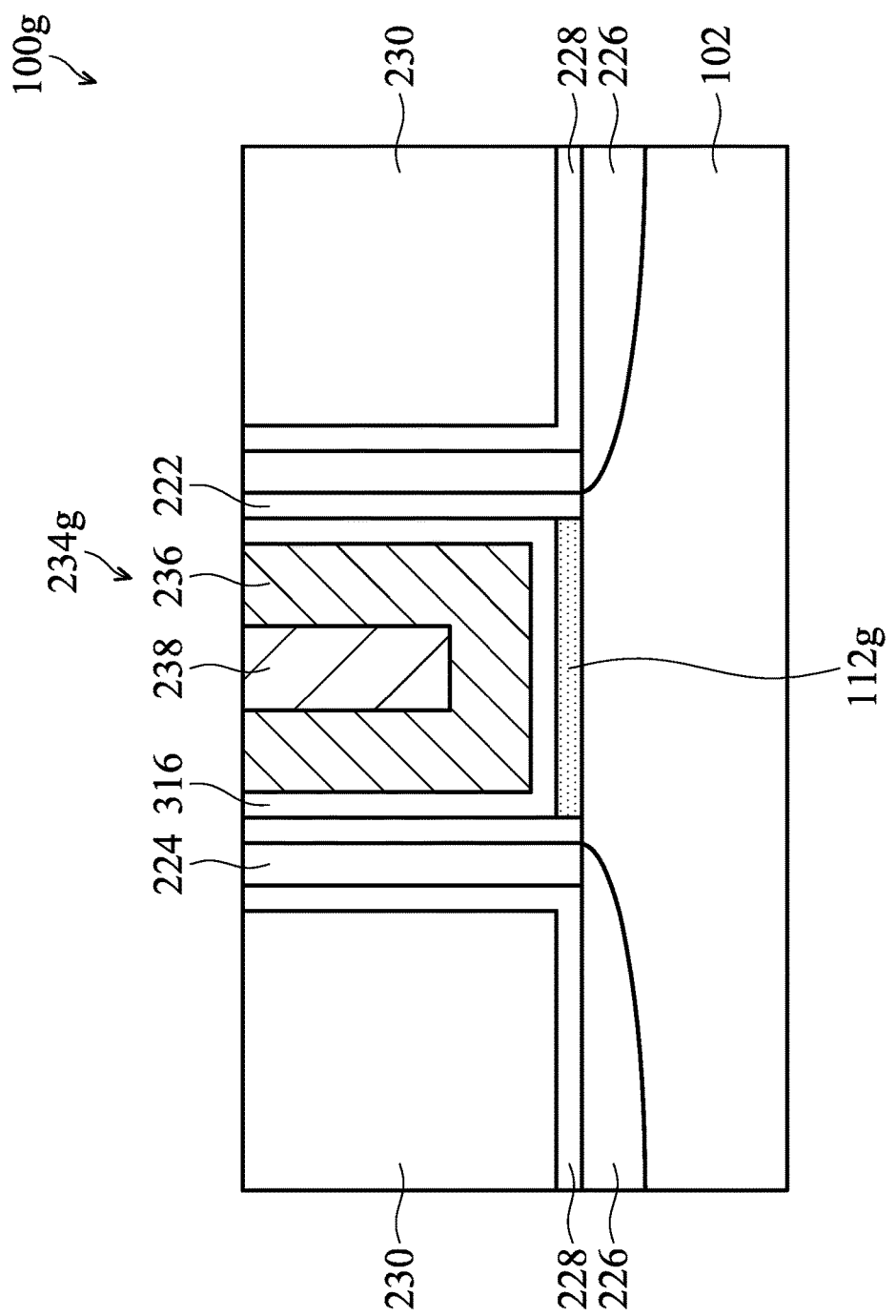

FIGS. 5A to 5C are cross-sectional representations of various stages of forming a semiconductor structure 100g including interfacial layer 112 in accordance with some embodiments. Some of the processes and materials used to form semiconductor structure 100g are similar to those used to form semiconductor structure 100c to 100f and are not repeated herein. In semiconductor structure 100g, interfacial layer 112 is also formed over substrate 102 but it is formed in a trench 332 over substrate 102.

More specifically, a dummy gate structure may be removed to form trench 332 between spacers 224 over substrate 102, as shown in FIG. 5A in accordance with some embodiments. After trench 332 is formed, interfacial layer 112g is formed over the top surface of substrate 102 exposed by trench 332, as shown in FIG. 5B in accordance with some embodiments. The formation of interfacial layer 112g may be the same as, or similar to, those shown in FIGS. 1A to 2B and described previously and are not repeated herein.

After interfacial layer 112g is formed, a gate structure 234g is formed in trench 332 over interfacial layer 112g, as shown in FIG. 5C in accordance with some embodiments. In addition, gate structure 234g includes a gate dielectric layer 316, work function metal layer 236, and gate electrode layer 238 in accordance with some embodiments.

Figure 6A:
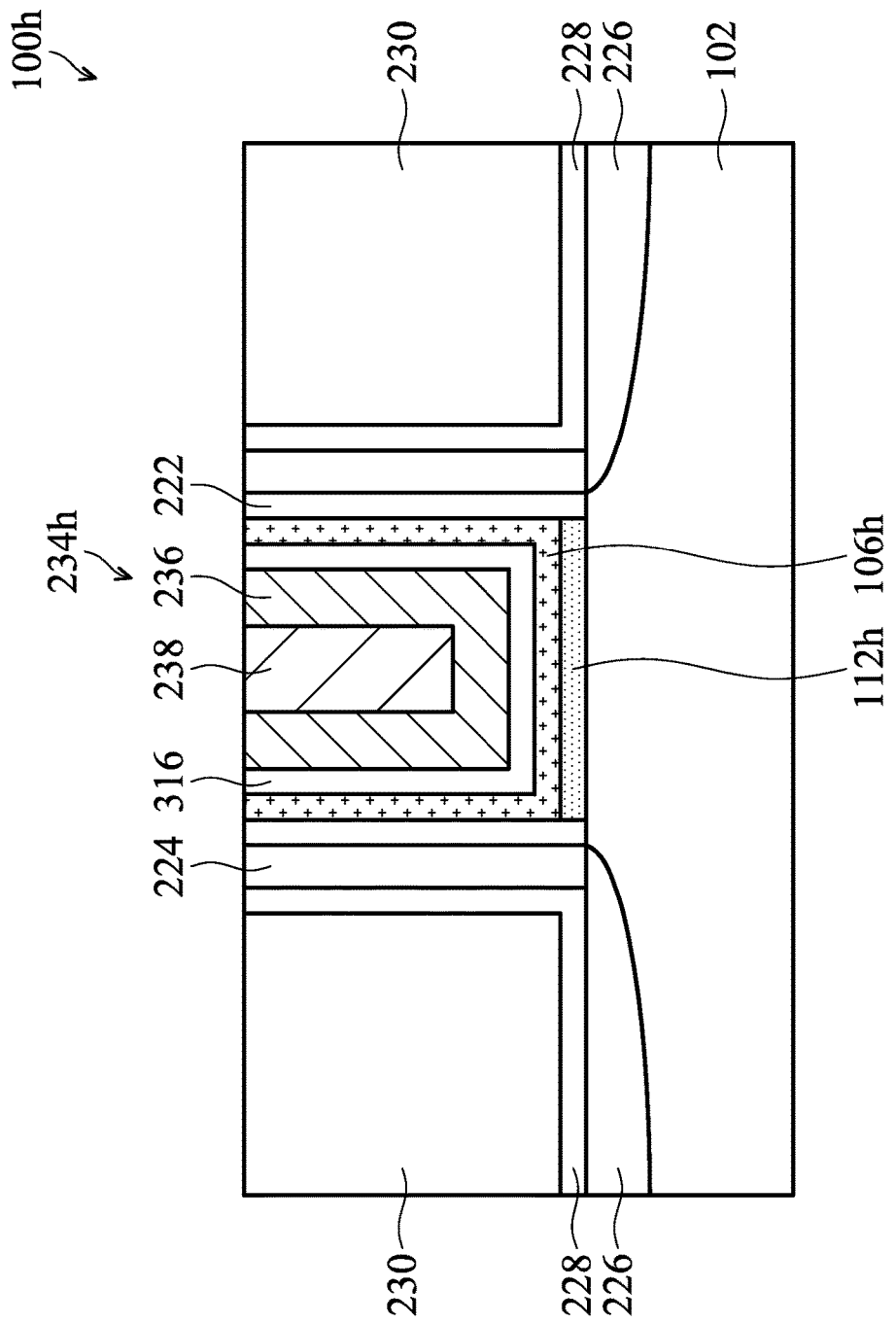
FIGS. 6A to 6B are cross-sectional representations of semiconductor structures including interfacial layers in accordance with some embodiments.
Figure 6B:
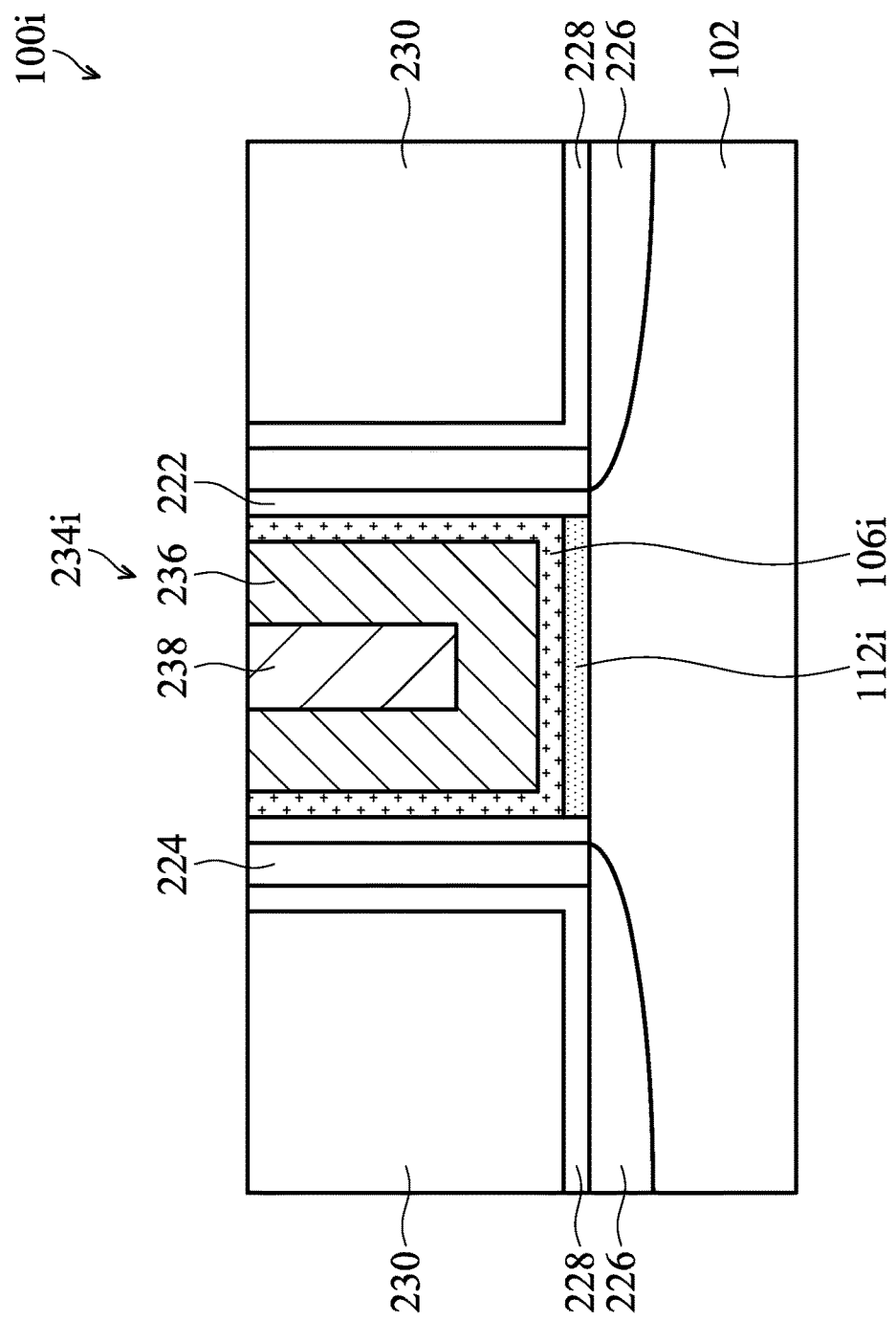

FIGS. 6A and 6B are cross-sectional representations of semiconductor structures 100h and 100i in accordance with some embodiments. Some processes and materials used to form semiconductor structures 100h and 100i may be similar to, or the same as, those used to form semiconductor structure 100g and are not repeated herein.

More specifically, interfacial layer 112h in semiconductor structure 100h shown in FIG. 6A may also be formed in a trench over substrate after a dummy gate structure is removed. In addition, when interfacial layer 112h is formed, first metal oxide layer 106h is positioned over interfacial layer 112h and is not removed afterwards. Accordingly, a gate structure 234h is formed over first metal oxide layer 106h, as shown in FIG. 6A in accordance with some embodiments. In some embodiments, gate structure 234h includes gate dielectric layer 316, work function metal layer 236, and gate electrode layer 238. As shown in FIG. 6A, since first metal oxide layer 106h is deposited in the trench formed by removing the dummy gate structure, similar to trench 332 shown in FIG. 5A, first metal oxide layer 106h is formed on the sidewalls and the bottom surface of the trench in accordance with some embodiments.

Semiconductor structure 100i shown in FIG. 6B are similar to semiconductor structure 100h shown in FIG. 6A, except gate dielectric layer 316 is not formed in accordance with some embodiments. That is, gate structure 234i includes work function metal layer 236 and gate electrode layer 238 formed over first metal oxide layer 106i and interfacial layer 112i in accordance with some embodiments. As shown in FIG. 6B, work function metal layer 236 is in direct contact with first metal oxide layer 106i.

Figure 7:
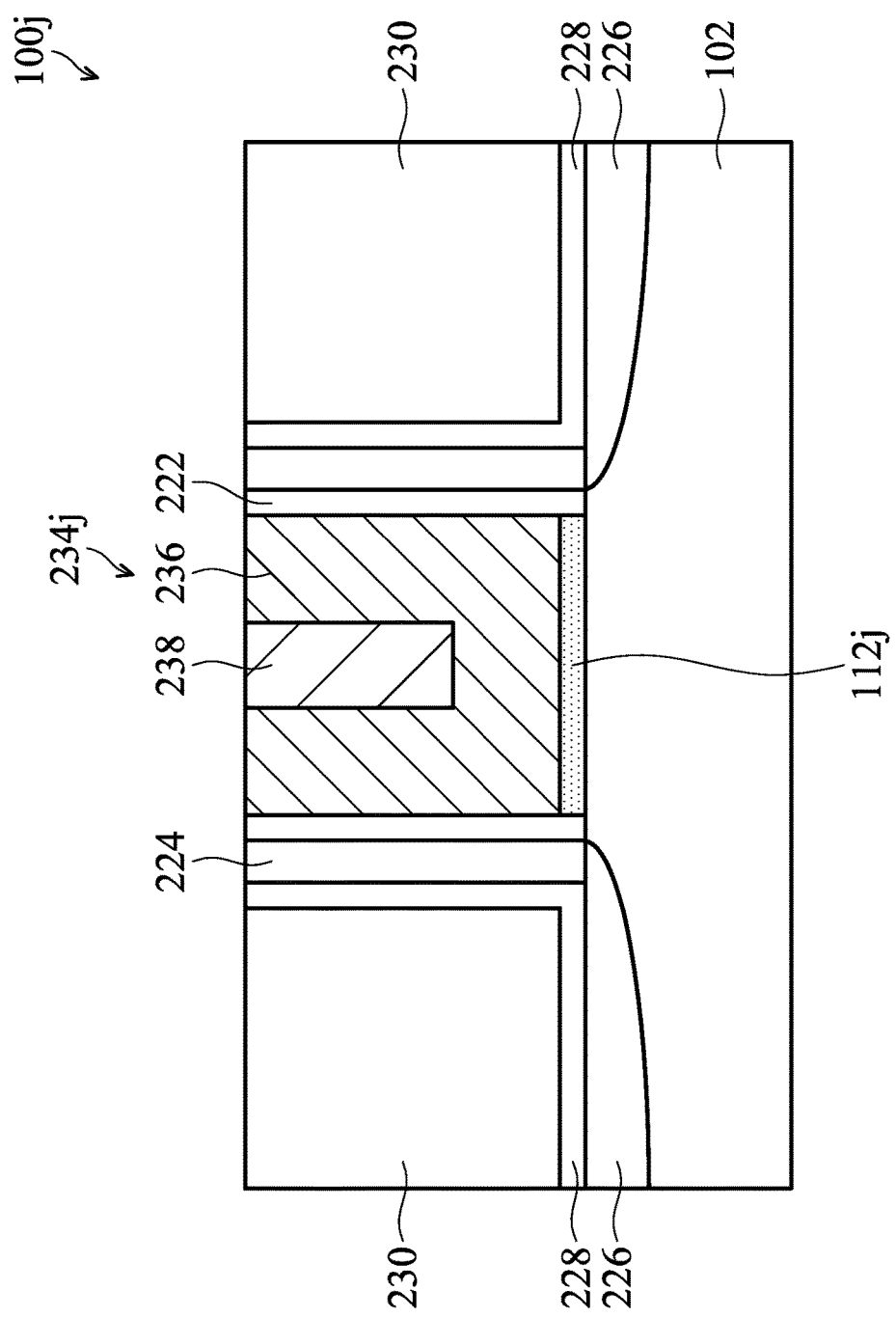
FIG. 7 is a cross-sectional representation of a semiconductor structure including an interfacial layer in accordance with some embodiments.

FIG. 7 is a cross-sectional representation of semiconductor structure 100j in accordance with some embodiments. Semiconductor structure 100j includes an interfacial layer 112j formed over substrate 102 and a gate structure 234j, including work function metal layer 236 and gate electrode layer 238, formed over interfacial layer 112j. The processes and materials used to form semiconductor structure 100j may be similar to, or the same as, those described previously and are not repeated herein. For example, processes and materials used to form interfacial layer 112j may be similar to, or the same as, those shown in FIGS. 1A to 2B and described previously. In some embodiments, interfacial layer 112j is used as a gate dielectric layer position below gate structure 234j.

As shown in FIGS. 1A to 7 and described previously, an interfacial layer (e.g. interfacial layer 112) is formed over substrate 102. The interfacial layer may be made of a material containing metal, oxygen, and a material used to form substrate 102. For example, the interfacial layer may be made of metal germanium oxide, metal silicon oxide, or metal germanium silicon oxide. These materials are relatively more stable, and therefore the interfacial layer may be formed over a channel region in substrate 102.

Generally, an interfacial layer may be formed in a semiconductor structure by oxidizing the top surface of a substrate. For example, when the substrate is a germanium substrate, a $GeO_2$ layer may be formed over the substrate to be used as an interfacial layer. However, $GeO_2$ is not stable and defects tend to be formed on the top portion of the $GeO_2$ layer. Therefore, the performance of the semiconductor structure may be undermined.

Accordingly, in some embodiments of the disclosure, oxide layer 104 is further reacted with first metal oxide layer 106 to form interfacial layer 112. The resulting interfacial layer 112 may have a better stability than oxide layer 104. For example, a metal germanium oxide layer, such as an aluminum germanium oxide layer, may have a better stability than a $GeO_2$ layer. Therefore, when the interfacial layer is made of a metal germanium oxide layer (or a metal silicon oxide layer or a metal germanium silicon oxide layer) as described previously in various embodiments, the performance of the semiconductor structure may be improved.

In addition, in some embodiments, the interfacial layer is formed by reacting an oxide layer (e.g. oxide layer 104) and a first metal oxide layer (e.g. first metal oxide layer 106) in a spontaneous reaction. More specifically, oxide layer 104 is formed on substrate 102, and first metal oxide layer 106 is formed on oxide layer 104 in accordance with some embodiments. Afterwards, metal layer 108 is formed on first metal oxide layer 106. When metal layer 108 is formed over first metal oxide layer 106, metal layer 108 tends to capture the oxygen in first metal oxide layer 106 to form second metal oxide layer 110. Therefore, the top portion of first metal oxide layer 106 will spontaneously react with metal layer 108 at a relatively low temperature (e.g. lower than 100° C.).

In addition, since the oxygen in first metal oxide layer 106 is captured by metal layer 108 formed above it, first metal oxide layer 106 tends to captured oxygen in oxide layer 104 to form interfacial layer 112. That is, the bottom portion of first metal oxide layer 106 will spontaneously react with oxide layer 104 at a relatively low temperature (e.g. lower than 100° C.). In addition, in some embodiments, the material used to form first metal oxide layer 106 is chosen to have a standard free energy that is smaller than the standard free energy of the material used to form oxide layer 104 in accordance with some embodiments. The resulting interfacial layer 112 may have a relatively low equivalent oxide thickness (e.g. smaller than 10 nm) and low interface trap (e.g. smaller than $1E^{12}$ $cm^{-2}$ $eV^{-1}$), compared to the same material formed under high temperature (e.g. higher than 100° C.).

Accordingly, interfacial layer 112 can be applied to various devices, such as a transistor structure. In some embodiments, the interfacial layer (e.g. interfacial layers 112c to 112j) is formed over a channel region of a semiconductor structure (e.g. semiconductor structures 100c to 100j) as a passivation layer of the channel region. As described previously, the interfacial layer is relatively more stable and has low EOT and Dit, and therefore the performance of the semiconductor structure can be improved.

Embodiments of semiconductor structures and methods for manufacturing the same are provided. The semiconductor structure includes an interfacial layer. The interfacial layer may be formed by reacting an oxide layer and a metal oxide layer under a relatively low temperature, such that the resulting semiconductor structure may have low equivalent oxide thickness (EOT) and low interface trap (Dit). Therefore, the performance of the semiconductor structure can be improved.

In some embodiments, a semiconductor structure is provided. The semiconductor structure includes a substrate and an interfacial layer formed over the substrate. The semiconductor structure further includes a gate structure formed over the interfacial layer. In addition, the interfacial layer is made of metal germanium oxide, metal silicon oxide, or metal germanium silicon oxide and is in direct contact with a top surface of the substrate.

In some embodiments, a semiconductor structure is provided. The semiconductor structure includes a substrate made of a first compound and an interfacial layer formed over the substrate. In addition, the interfacial layer is made of a second compound, and the second compound comprises metal, oxygen, and the first compound. The semiconductor structure further includes a cap layer formed over the interfacial layer.

In some embodiments, a method for manufacturing a semiconductor structure is provided. The method for manufacturing a semiconductor structure includes forming an oxide layer over a substrate and forming a first metal oxide layer over the oxide layer. The method for manufacturing a semiconductor structure further includes forming a metal layer over the first metal oxide layer, such that a top portion of the first metal oxide layer reacts with the metal layer to form a second metal oxide layer and a bottom portion of the first metal oxide layer reacts with the oxide layer to form an interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    (a) forming an oxide layer over a substrate;
    (b) forming a first metal oxide layer over the oxide layer;
    (c) forming a metal layer over the first metal oxide layer, such that a top portion of the first metal oxide layer spontaneously reacts with the metal layer to form a second metal oxide layer and a bottom portion of the first metal oxide layer spontaneously reacts with the oxide layer to form an interfacial layer at a temperature lower than 100° C.,
    wherein the interfacial layer is made of a ternary compound.

2. The method for manufacturing a semiconductor structure as claimed in claim 1, wherein the first metal oxide layer is made of a material comprising Al, Y, Ga, Sc, La, Ce, Pr, Nd, Pm, Sm, Eu, Gd, Tb, Dy, Ho, Er, Tm, Yb, or Lu.

3. The method for manufacturing a semiconductor structure as claimed in claim 1, wherein the interfacial layer is formed in a spontaneous reaction under a temperature in a range from about 0° C. to about 50° C.

4. The method for manufacturing a semiconductor structure as claimed in claim 1, wherein the oxide layer is formed by oxidizing a top surface of the substrate.

5. The method for manufacturing a semiconductor structure as claimed in claim 1, wherein the interfacial layer is made of metal germanium oxide, metal silicon oxide, or metal germanium silicon oxide.

6. The method for manufacturing a semiconductor structure as claimed in claim 1, further comprising:
    removing the metal layer and the second oxide layer after the interfacial layer is formed; and
    forming a gate structure over the interfacial layer.

7. A method for manufacturing a semiconductor structure, comprising:
    (a) oxidizing a top surface of a substrate to form an oxide layer over the substrate;
    (b) forming a first metal oxide layer over the oxide layer;
    (c) forming a metal layer over the first metal oxide layer, such that the oxide layer spontaneously reacts with a bottom portion of the first metal oxide layer to form an interfacial layer at a temperature lower than 100° C.,
    wherein the interfacial layer is made of metal germanium oxide, metal silicon oxide, or metal germanium silicon oxide.

8. The method for manufacturing a semiconductor structure as claimed in claim 7, further comprising:
    removing the metal layer after the interfacial layer is formed; and
    forming a gate structure over the interfacial layer.

9. The method for manufacturing a semiconductor structure as claimed in claim 7, wherein the metal layer spontaneously reacts with a top portion of the first metal oxide layer to form a second metal oxide layer.

10. The method for manufacturing a semiconductor structure as claimed in claim 7, wherein the interfacial layer is made of a ternary compound.

11. A method for manufacturing a semiconductor structure, comprising:
  (a) forming an oxide layer over a substrate;
  (b) forming a first metal oxide layer over the oxide layer;
  (c) spontaneously forming an interfacial layer between the substrate and the first metal oxide layer at a temperature lower than 100° C. by forming a metal layer over the first metal oxide layer; and
  (d) removing the metal layer and the first metal oxide layer,
  wherein the interfacial layer is made of a ternary compound.

12. The method for manufacturing a semiconductor structure as claimed in claim 11, wherein when the metal layer is formed over the first metal oxide layer, the metal layer reacts with a top portion of the first metal oxide layer to form a second metal oxide layer.

13. The method for manufacturing a semiconductor structure as claimed in claim 11, wherein after the metal layer is formed, a top portion of the first metal oxide layer reacts with the metal layer to form a second metal oxide layer, and a bottom portion of the first metal oxide layer reacts with the oxide layer to form the interfacial layer.

14. The method for manufacturing a semiconductor structure as claimed in claim 11, wherein the interfacial layer is made of a material comprising Al, Y, Ga, Sc, La, Ce, Pr, Nd, Pm, Sm, Eu, Gd, Tb, Dy, Ho, Er, Tm, Yb, or Lu.

* * * * *